United States Patent
Kagoshima et al.

(10) Patent No.: US 6,881,352 B2
(45) Date of Patent: Apr. 19, 2005

(54) DISTURBANCE-FREE, RECIPE-CONTROLLED PLASMA PROCESSING METHOD

(75) Inventors: Akira Kagoshima, Kudamatsu (JP); Hideyuki Yamamoto, Kudamatsu (JP); Shoji Ikuhara, Hikari (JP); Toshio Masuda, Toride (JP); Hiroyuki Kitsunai, Chiyoda (JP); Junichi Tanaka, Tsuchiura (JP); Natsuyo Morioka, Tokyo (JP); Kenji Tamaki, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/350,061

(22) Filed: Jan. 24, 2003

(65) Prior Publication Data

US 2003/0113945 A1 Jun. 19, 2003

Related U.S. Application Data

(62) Division of application No. 09/946,503, filed on Sep. 6, 2001, now Pat. No. 6,733,618.

(30) Foreign Application Priority Data

Jun. 29, 2001 (JP) ...................................... 2001-198830

(51) Int. Cl.[7] .............................................. H01L 21/00
(52) U.S. Cl. .............................. 216/59; 216/60; 438/9; 438/16; 427/8
(58) Field of Search .............................. 438/5, 6, 7, 8, 438/9, 10, 11, 12, 13, 16, 17, 714; 216/59, 60, 61; 427/8

(56) References Cited

U.S. PATENT DOCUMENTS

| | | | |
|---|---|---|---|
| 5,240,554 A | * | 8/1993 | Hori et al. .................. 438/702 |
| 5,711,843 A | | 1/1998 | Jahns |
| 6,225,639 B1 | | 5/2001 | Adams et al. |
| 6,625,513 B1 | * | 9/2003 | Lymberopoulos et al. .. 700/121 |

FOREIGN PATENT DOCUMENTS

| | | |
|---|---|---|
| JP | 10-125660 | 5/1998 |
| JP | 11-162820 | 6/1999 |
| JP | 2001-110791 | 4/2001 |
| WO | WO 01/18845 A1 | 3/2001 |

* cited by examiner

*Primary Examiner*—Luz Alejandro-Mulero
(74) *Attorney, Agent, or Firm*—Antonelli, Terry, Stout & Kraus, LLP

(57) ABSTRACT

A plasma processing control system and method which can suppress influences caused by disturbances. The control system includes a plasma processor for performing processing operation over a sample accommodated within a vacuum processing chamber, a sensor for monitoring process parameters during processing operation of the plasma processor, a processed-result estimation model for estimating a processed result on the basis of a monitored output of the sensor and a preset processed-result prediction equation, and an optimum recipe calculation model for calculating correction values of processing conditions on the basis of an estimated result of the processed-result estimation model in such a manner that the processed result becomes a target value. The plasma processor is controlled on the basis of a recipe generated by the optimum recipe calculation model.

3 Claims, 15 Drawing Sheets

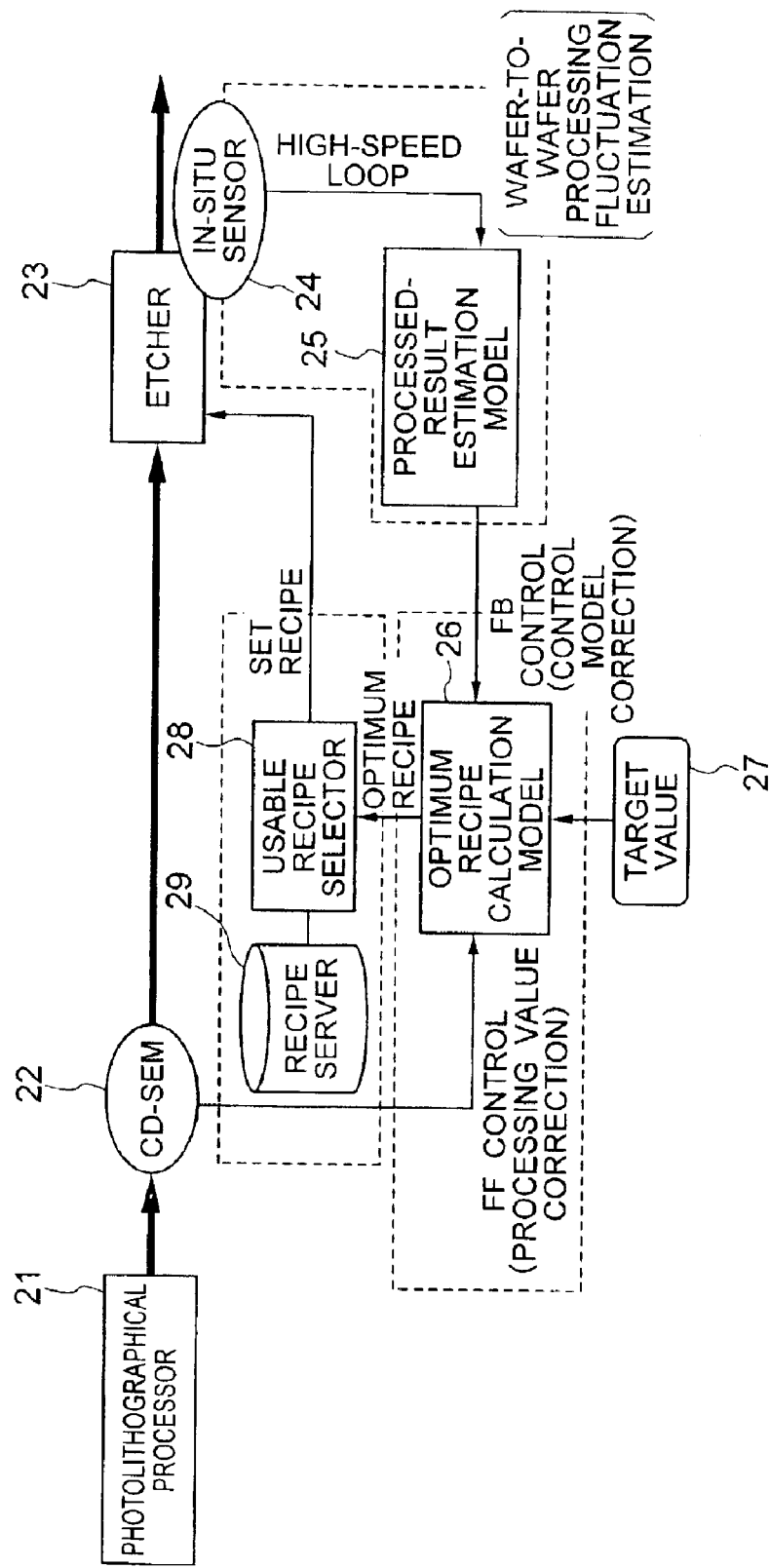

DISTURBANCE-FREE, RECIPE-CONTROLLED PLASMA PROCESSING METHOD

CROSS REFERENCE TO RELATED APPLICATION

This is a divisional of U.S. application Ser. No. 09/946,503, filed Sep. 6, 2001, now U.S. Pat. No. 6,733,618, the subject matter of which is incorporated by reference herein.

BACKGROUND OF THE INVENTION

The present invention relates to plasma processing systems and methods and more particularly, to a plasma processing system and method which can suppress influences caused by a disturbance.

As a plasma processing system, there is known, for example, a system wherein an etching gas is introduced into a vacuum processing chamber so that plasma is generated under a vacuum pressure, and radicals or ions generated in the plasma react with a surface of a wafer to be processed for etching. In the dry etching system for performing such processing, the etching is carried out under manufacturing conditions (gas flow rate, gas pressure, input power, etching time, etc.) called recipe. The recipe is always kept constant in a specific manufacturing step (in the same process) of a semiconductor device. In this connection, the single process may sometimes be divided into several steps and the manufacturing conditions may be changed for each of the steps.

SUMMARY OF THE INVENTION

When a process using a dry etching system is executed in a semiconductor manufacturing step, wafer processing is carried out with manufacturing conditions called the recipe set constant for each wafer processing.

In a recent dry etching process which demands finer processing, however, a product generated by a reaction between a wafer and an etching gas is deposited on an inner wall of a processing chamber, an unnecessary gas called outgas is produced from the deposit, which results in a change with time in an environment within the processing chamber. Further, the environment within the chamber is also changed even by the temperature change of parts associated with the chamber and by the wear of the parts. Such a dry etching system is susceptible to various disturbance factors.

In addition, even variations in the shape dimensions of a mask formed in a lithography step as a pretreatment of the above etching processing have also a great effect on its etched result.

That is, even when etching processing is carried out with a constant recipe, it is difficult to obtain a constant performance due to various disturbances.

In view of the problems in the prior art, it is therefore an object of the present invention to provide a plasma processing control system and method which can suppress influences caused, in particular, by disturbances.

In order to solve the above problems, in accordance with an aspect of the present invention, there is provided a plasma processing control system which includes a plasma processor for performing plasma processing operation over a sample accommodated within a vacuum processing chamber, a sensor for monitoring process parameters during processing operation of the processor, means for providing a processed-result estimation model to estimate a processed result on the basis of a monitored output from the sensor and a preset processed-result prediction equation, means for providing an optimum recipe calculation model to calculate optimum processing conditions in such a manner that the processed result becomes a target value on the basis of the estimated result of the processed-result estimation model, and a controller for controlling the plasma processing system on the basis of the recipe generated using the optimum recipe calculation model.

In accordance with another aspect of the present invention, there is provided a method for performing plasma processing operation over a sample accommodated within a vacuum processing chamber, which includes the steps of monitoring process parameters during the processing operation, estimating a processed result on the basis of the monitored result, calculating correction values of processing conditions in such a manner that the processed result becomes a target value on the basis of an estimated result of the processed result to thereby generate an optimum recipe, and controlling a plasma processor on the basis of the generated optimum recipe.

Other objects, features and advantages of the present invention will become apparent from the following description of the embodiments of the invention taken in conjunction with the accompanying drawings.

BRIEF DESCRIPTION OF THE DRAWINGS

FIG. 16 is an additional embodiment of the dry etching system.

DETAILED DESCRIPTION OF THE EMBODIMENTS

Figure 1:
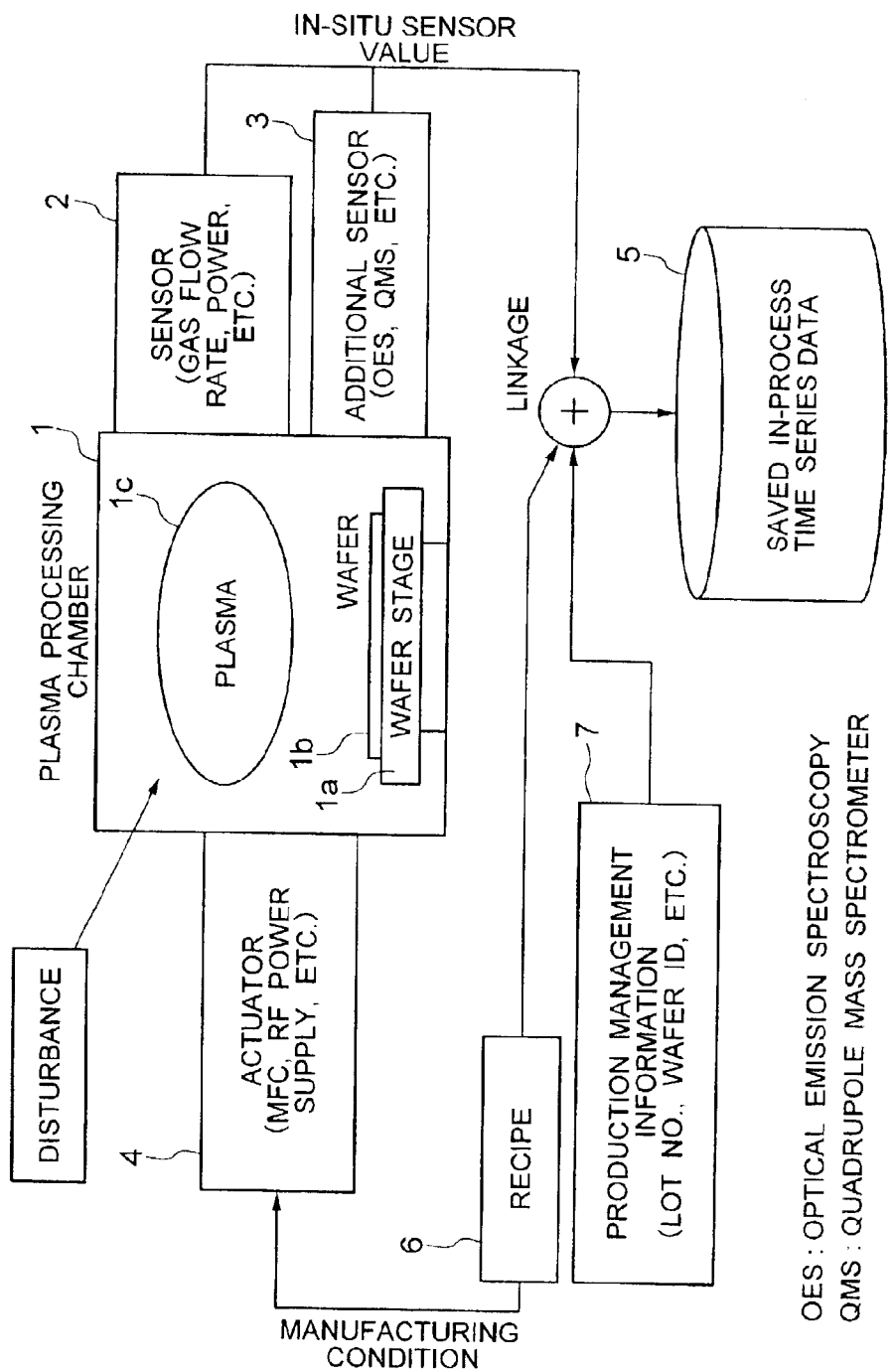
FIG. 1 is a block diagram of a dry etching system in accordance with an embodiment of the present invention.

FIG. 1 shows a block diagram of a dry etching system in accordance with an embodiment of the present invention. In FIG. 1, reference numeral 1 denotes a plasma processor for generating a plasma 1c, and reference symbol 1b denotes a wafer as an object to be processed which is mounted in a wafer stage 1a within a processing chamber. Reference numeral 2 denotes sensors for monitoring in-process parameters including a flow rate, pressure of a gas supplied to the dry etching system and an input power thereof. These sensors are usually incorporated as standard components in the dry etching system. Reference numeral 3 denotes an additional sensor such as an optical emission spectroscopy (OES) for analyzing a spectrum of plasma light or a quadrupole mass spectrometer (QMS) for analyzing the mass of a plasma particle. Reference numeral 4 denotes an actuator for controlling the dry etching system according to data indicative of a recipe 6, numeral 5 denotes a database for saving therein in-process parameters linked to the recipe or production management information such as a lot number or wafer ID. In this connection, the recipe may be changed during processing operation of the wafer or for each wafer processing operation.

Figure 2:
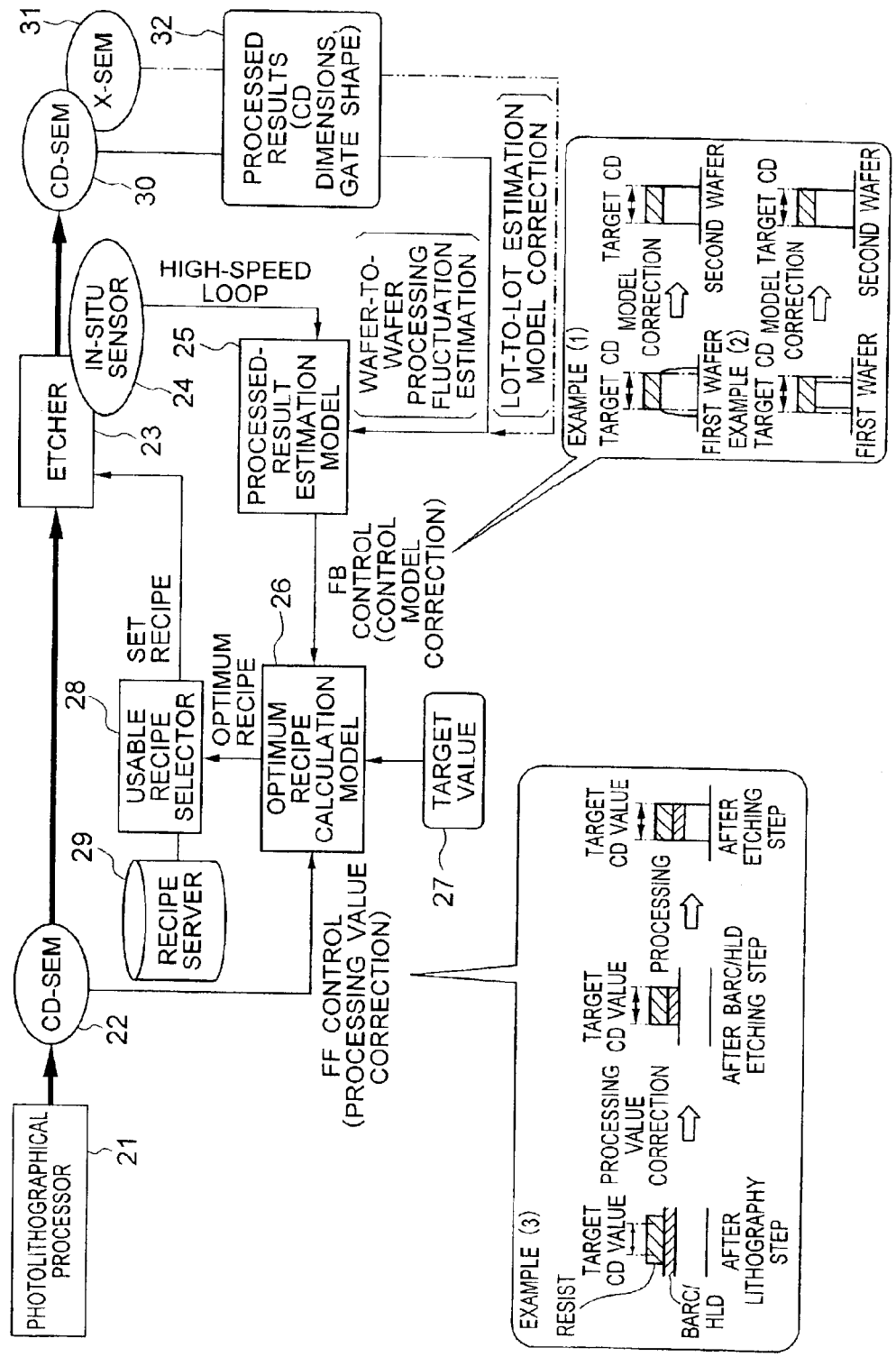
FIG. 2 shows an arrangement of the entire dry etching system.

FIG. 2 is an arrangement of an entire dry etching system in accordance with a first embodiment of the present invention. The system includes a feedback (FB) control system and a feedforward (FF) system.

In FIG. 2, reference numeral 21 denotes a photolithographical processor which coats a resist on, e.g., semiconductor substrate and etches the resist in such a manner that, for example, a gate electrode having a desired electrode width can be obtained at a gate part of a field-effect transistor (FET) as a target. The target value of the electrode width or the value of a processed result will be referred to as the critical dimension (CD) value, hereinafter. Reference numeral 22 denotes a measuring instrument such as a CD-scanning electron microscope (SEM) for measuring the CD value of the resist after the etching process, numeral 23 denotes a plasma etcher, and 24 denotes sensors (which will be referred to as in-situ sensors, hereinafter) for monitoring a flow rate and pressure of a gas supplied to the plasma etcher, an input power thereof, and in-process parameters of the OES and QMS. Reference numeral 25 denotes information indicative of a processed-result estimation model which is used to estimate a processed result (e.g., the aforementioned CD value of the processed result) with use of monitored outputs of the in-situ sensors or a processed-result prediction equation. In this conjunction, since the in-situ sensors can monitor each wafer during the wafer processing operation, the estimation model can be used to estimate a processed result for each wafer. Further, the estimation model can be corrected based on an output of an instrument for measuring a processed result (which will be explained later).

Reference numeral 26 denotes information indicative of an optimum recipe calculation model, which can be corrected on the basis of the estimated result of the processed-result estimation model and a target value 27, e.g., as shown by Example 1 or 2 in the drawings to generates an optimum recipe. Further, in the calculation model, the output of the measuring instrument 22 such as the CD-SEM can be used as a feedforward control input as shown in Example 3.

Reference numeral 28 denotes a usable recipe selecting means which acts to select one of recipes stored in a recipe server 29 which is the closest to the optimum recipe generated by the optimum recipe calculation model and set it as a usable recipe.

Reference numeral 30 denotes a critical dimension scanning electron microscope (CD-SEM) for measuring the CD value of a processed result, and numeral 31 denotes a processed result measuring instrument such as a cross section scanning electron microscope (X-SEM) which outputs a processed result as the CD value or gate shape signal 32. In this connection, the CD-SEM 30 and measuring instrument such as the X-SEM 31 sample wafers for each processing unit of the plasma etcher, that is, on a lot basis, for measurement. For this reason, the CD value or gate shape can be obtained for each lot.

Figure 3:
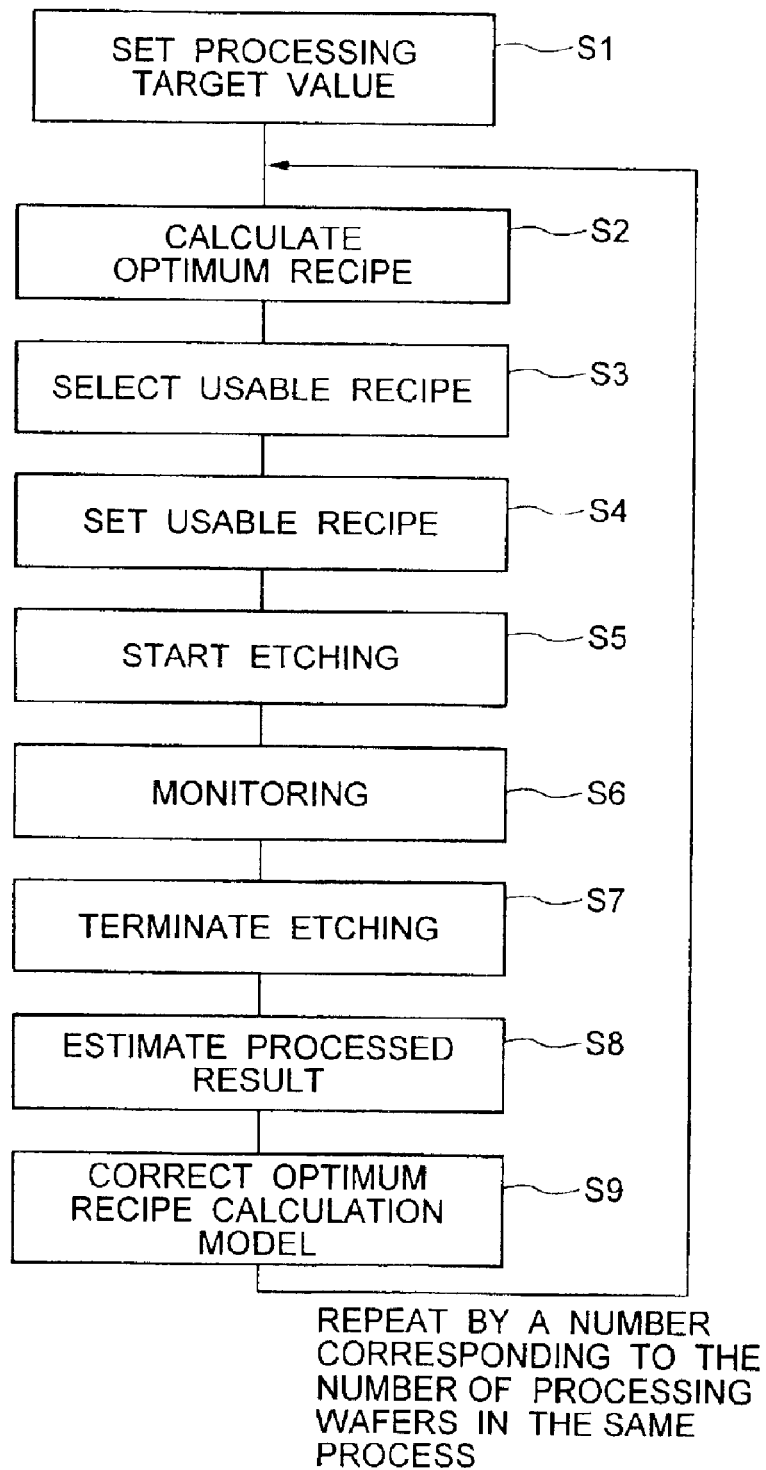
FIG. 3 is a flowchart for explaining feedback control of the dry etching system.
Figure 4:
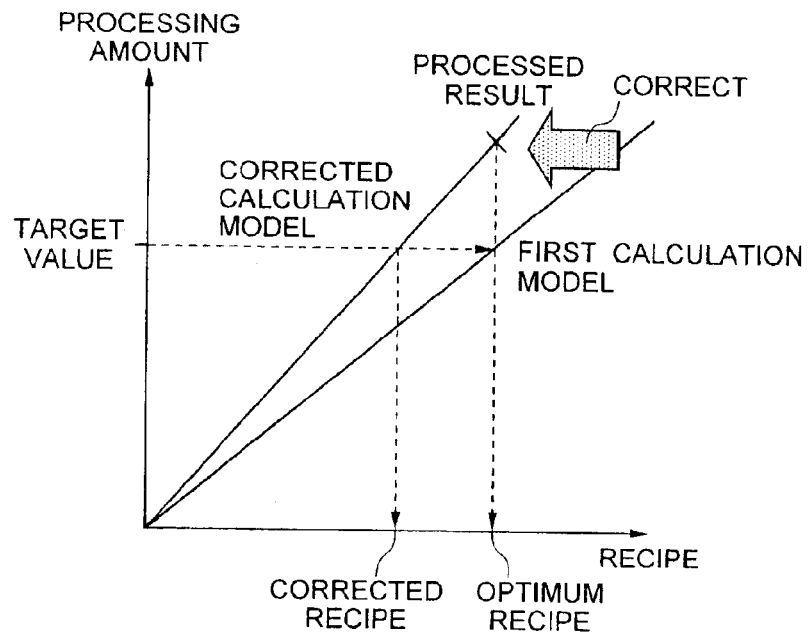
FIG. 4 is a diagram for explaining how to correct an optimum recipe calculation model.

FIG. 3 is a flowchart for explaining feedback control of the dry etching system of the present embodiment. In a step 1, first, the system set a processing target value (CD value). In a step 2, the system calculates an optimum recipe for attaining the target value from the processing target value on the basis of the optimum recipe calculation model. The system selects in a step 3 one of recipes which is the closest to the optimum recipe and sets in a step 4 the selected recipe for the plasma etcher 23. In a step 5, the system starts its etching operation. In a step 6, the system monitors a state of the system during the etching operation with use of the in-situ sensors. When completing etching operation corresponding to a single wafer in a step 7, the system estimates a processed result of the wafer on the basis of the measured values of the in-situ sensors and with use of the processed-result estimation model in a step 8. In a step 9, the system corrects the optimum recipe calculation model on the basis of the estimated processed result and target value as shown in FIG. 4, and sets the corrected optimum recipe for the plasma etcher 23. The system then proceeds to the step 2 for processing of the next wafer.

As mentioned above, further, wafers in each lot may be sequentially sampled one after another, actual dimensions of each wafer may be measured by the CD-SEM 30 or the processed result measuring instrument such as the X-SEM 31, and a processed-result estimation model can be accurately corrected based on the measured results. The correction of the estimation model enables realization of highly accurate inspection comparable to the wafer total-number inspection by the above sampling inspection alone.

With such a control system, the processed result can be estimated with use of the measured values of the in-situ sensors and feedback control can be correspondingly carried out. Further, since the measured values of the in-situ sensors are used, when compared to a method (not using the in-situ sensors) of measuring actual dimensions of wafers with use of the CD-SEM 30 or the processed result measuring instrument such as the X-SEM 31 alone, the method of the present invention can form a high-speed feedback loop (feedback control loop for each wafer) and thus mass production of defective wafers can be suppressed.

Figure 5:
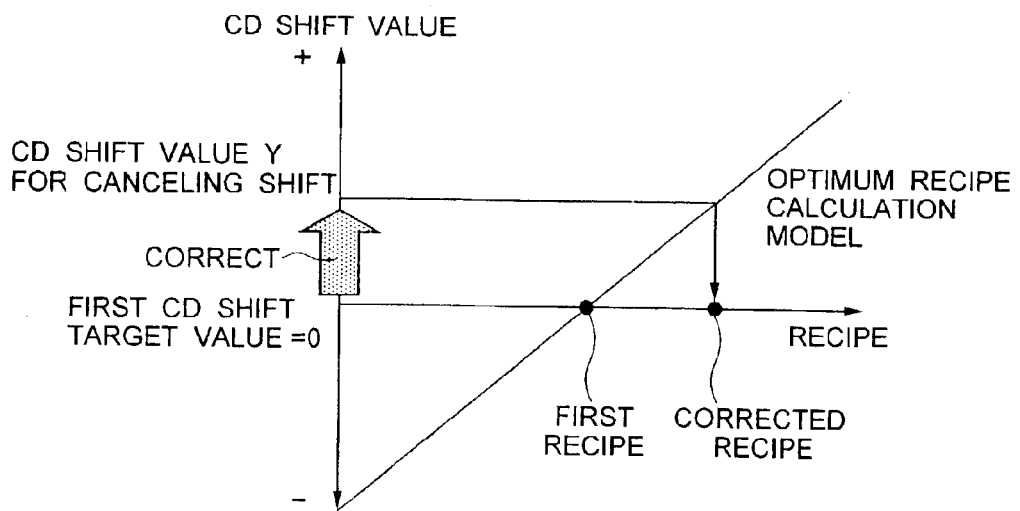
FIG. 5 is a diagram for explaining how to calculate an optimum recipe.

Explanation will next be made as to feedforward control of the dry etching system of the present embodiment by referring to FIGS. 2 and 5. A resist processing dimension (e.g., CD value) of the wafer processed by the photolithographical processor 21 is measured by the measuring instrument 22 such as the CD-SEM. The optimum recipe calculation model 26 compares the measured value with the target value 27 to obtain a difference or shift therebetween, estimates (Y in FIG. 5) a processing amount (CD shift value) for cancellation of the shift from the target value of the resist processing dimension in the photolithography step, and calculates an optimum recipe on the basis of the estimated value. The usable recipe selecting means 28 next selects one of recipes stored in the recipe server which is the closest to the optimum recipe generated by the optimum recipe calculation model, and sets the selected recipe as a usable recipe.

Shown in FIG. 4 is an example when the processed result in the photolithography step is larger than the target CD value. In such a case, resist is made thinner (slimming process) through etching operation so as to reach the target CD value, or the resist is adjusted through the etching operation of BARC/HLD (bottom anti-reflection coating/high temperature, low pressure dielectric) so as to reach the target CD value. Next etching operation is carried out with use of the resist having the target CD value or BARC/HLD as a mask. In this case, the system estimates a CD shift value generated by side-etching of the target resist, and calculates an optimum recipe on the basis of the estimated CD shift value with use of the optimum recipe calculation model as shown in FIG. 5. Thereafter the system selects usable one of the recipes which is the closest to the calculated optimum recipe and performs its etching operation over the resist using the selected recipe.

Similarly, the system, on the basis of the CD value of the resist, then calculates an optimum recipe with use of the optimum recipe calculation model, selects usable one of the recipes which is the closest to the calculated optimum recipe, performs its etching operation over the wafer based on the selected recipe, and completes its etching step.

Figure 6:
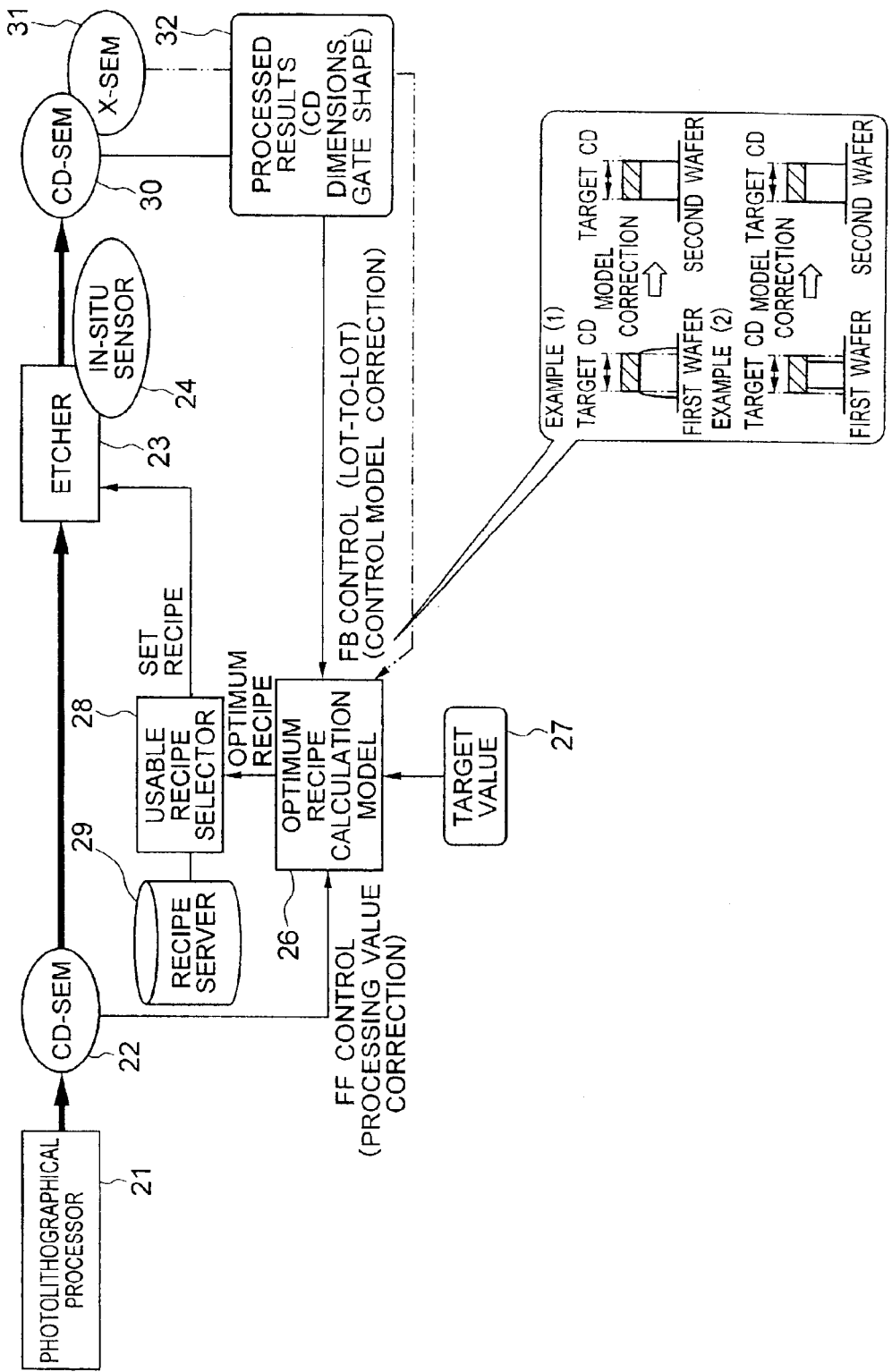
FIG. 6 shows another embodiment of the dry etching system.

FIG. 6 shows a block diagram of a dry etching system in accordance with another embodiment of the present invention. In FIG. 6, parts having the same functions as those in FIG. 2 are denoted by the same reference numerals, and explanation thereof is omitted. In this embodiment, such a processed-result estimation model as shown in FIG. 2 is not used. With no use of the model, the feedback loop speed becomes slow, but feedback using actually-measured data from the processed result measuring instrument 30 or 31 can be realized. For this reason, the optimum recipe calculation model can be more accurately corrected.

FIG. 16 shows a dry etching system in accordance with a further embodiment of the present invention. In the drawing, parts having the same functions as those in FIG. 2 are denoted by the same reference numerals, and explanation thereof is omitted. In this embodiment, as opposed to the embodiment of FIG. 6, the CD-SEM 30, X-SEM 31 and processed result 32 shown in FIG. 2 are not used. This is because, when the in-situ sensors 24 and processed-result estimation model 25 can be kept highly accurate as in the present embodiment, the need for model correction from the CD-SEM or the like can be eliminated. In this manner, a processing method which can eliminate the need for an inspection instrument such as the CD-SEM or X-SEM can be realized, and thus the number of inspection steps in manufacturing a semiconductor can be reduced.

Figure 7:
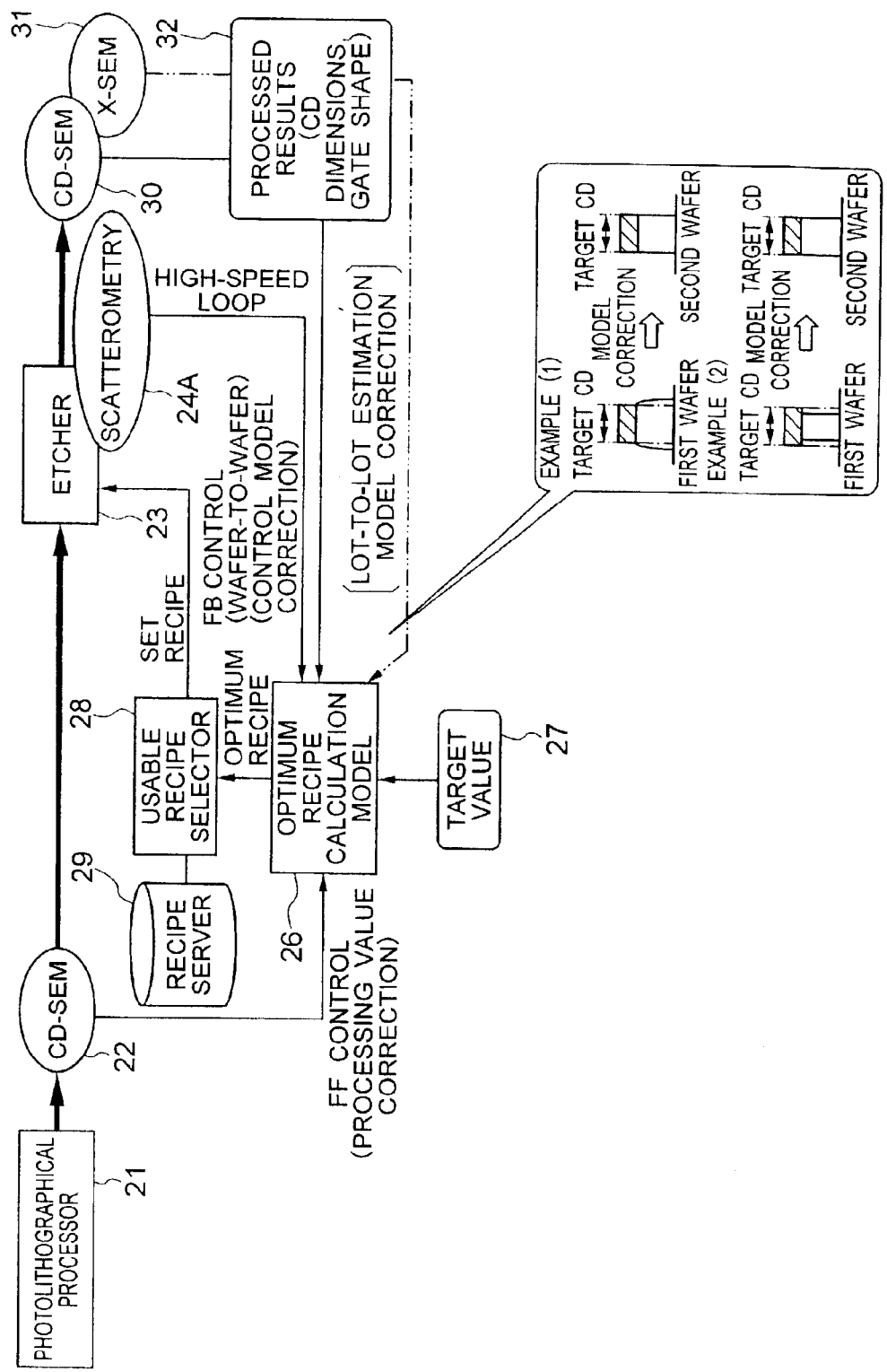
FIG. 7 shows a further embodiment of the dry etching system.

FIG. 7 shows a dry etching system in accordance with yet another embodiment of the present invention. In FIG. 7, parts having the same functions as those in FIG. 2 are denoted by the same reference numerals, and explanation thereof is omitted. In this embodiment, the in-situ sensors 24 shown in FIG. 2 are replaced by a scattered-light shape estimating means (scatterometry). The scatterometry radiates light on a plurality of lattice marks provided on a wafer with a wavelength or incident angle as a parameter to measure a reflectivity. The system then compares the measured reflectivity with a feature library previously made through theoretical computation, searches the library for a library waveform having a good matching therewith, and adjusts shape parameters to estimate shape and dimensions of the wafer formed by the plurality of grating marks.

Figure 15:
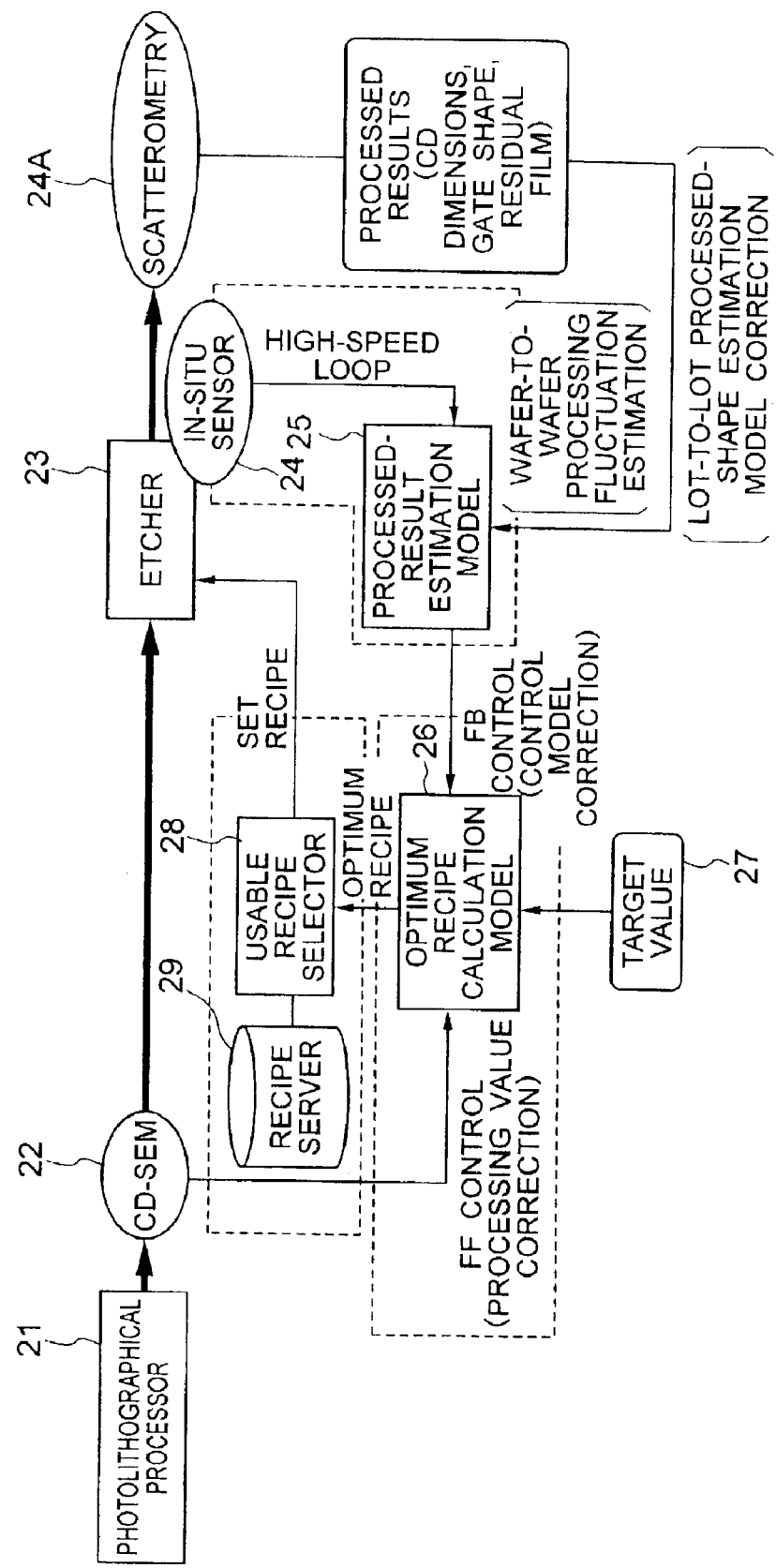
FIG. 15 is a still further embodiment of the dry etching system.

When the scatterometry 24A is used to measure a processed shape of the grating marks of the wafer sampled for each lot and to correct the processed-result estimation model 25 as in a modification example of FIG. 15, the shape estimation accuracy can be corrected without implementation of destructive inspection by the X-SEM.

The scatterometry 24A is built in the plasma etcher 23 as a measuring instrument (integrated metrology) for monitoring process parameters to measure the wafer immediately after etched within the etcher and to estimate dimensions and shape thereof. How to correct the optimum recipe calculation model based on the estimated result is substantially the same as in FIG. 2.

Figure 8:
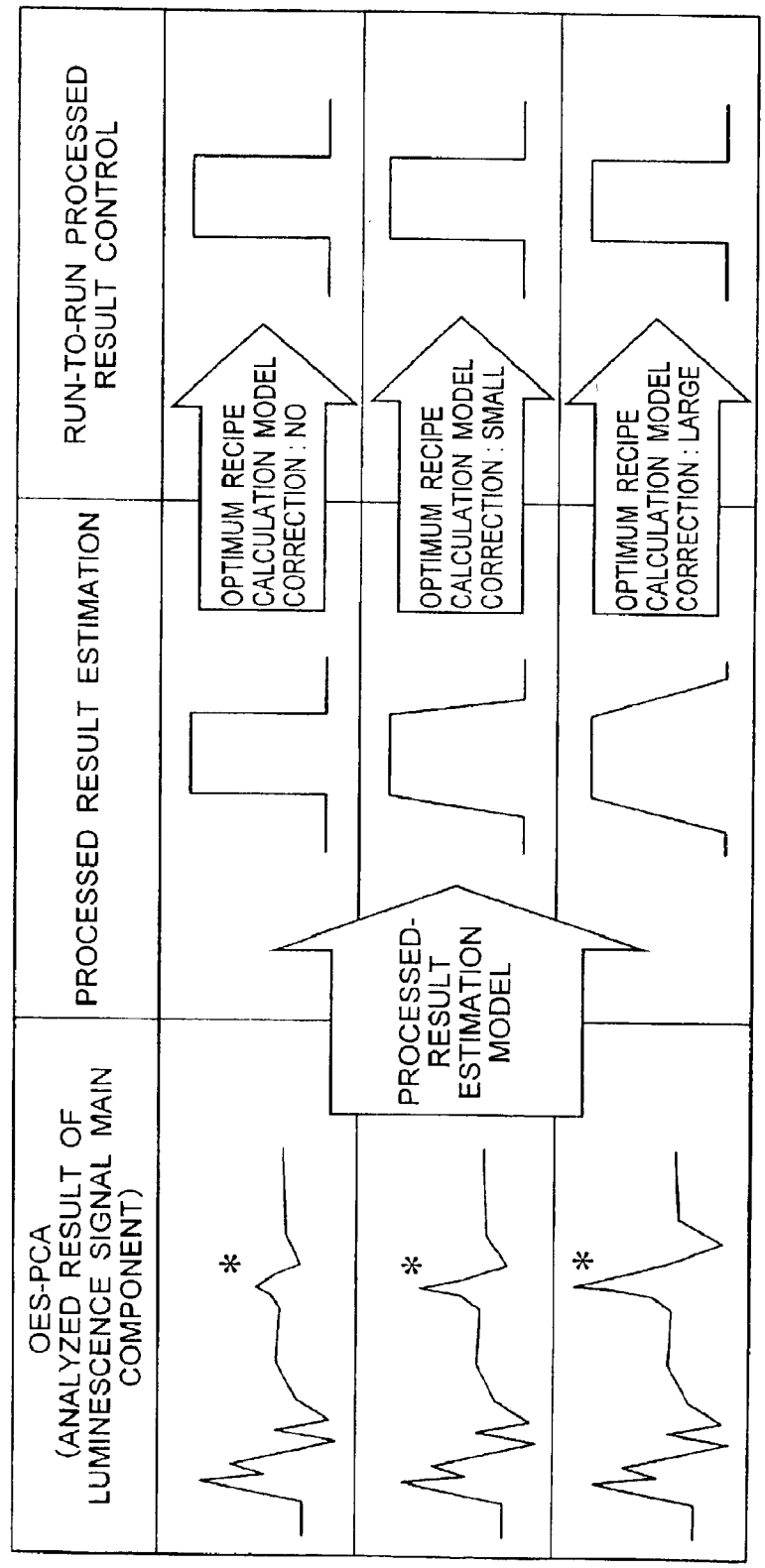
FIG. 8 shows processed result estimation and processing control effect using an in-situ sensor.

FIG. 8 shows processed result estimation and the effect of processing control using the in-situ sensor. FIG. 8 shows an example where the in-situ sensor measures, as an example, plasma luminescence during the processing operation. The plasma luminescence includes information about etchants or ions which dominate the process, and thus a change in the processed result can be estimated on the basis of a change in the peak intensity of the plasma luminescence or in the spectrum shape.

In this connection, since a change in the plasma luminescence is slight, it is desirable to apply some numerical data processing operation to the plasma luminescence to extract a changed component in the luminescence spectrum with a high sensitivity. The arithmetic processing includes, for example, finding of a ratio or difference with respect to a standard spectrum. Alternatively, when a statistical analysis technique, e.g., main component analysis is employed, only changed one of many luminescence peak components can be filtered and extracted.

Shown in a left column of FIG. 8 is a result of plasma luminescence after subjected to the numerical data processing. Mark * in the drawing indicates a change in the luminescence peak which influences the deposit of a side wall. On the basis of an analysis result of the luminescence peak, a processed result can be estimated based on the processed-result estimation model. The model is illustrated in a central column in FIG. 8, from which it can be estimated that, when compared to a predetermined processing shape (shown in the uppermost row), the side wall deposit is increased and a taper angle is increased as the luminescence peak varies.

On the basis of these results, the system calculates an optimum recipe for processing control. The calculation of the optimum recipe is realized by correcting a processing recipe. The correction is carried out according to a deviation from the processing target value. For example, when the taper angle coincides with a target value, no correction is applied; whereas, when the taper angle is large, the correction is set to be large. As a result, the taper angle can be kept constant as shown in a right column of FIG. 8. How to calculate the optimum recipe will be explained later. Although the in-situ sensor has been used to detect the plasma luminescence here, it is also possible, in addition to the above, to use, for example, discharge voltage (Vpp), bias voltage (Vdc) or impedance monitor.

Figure 9:
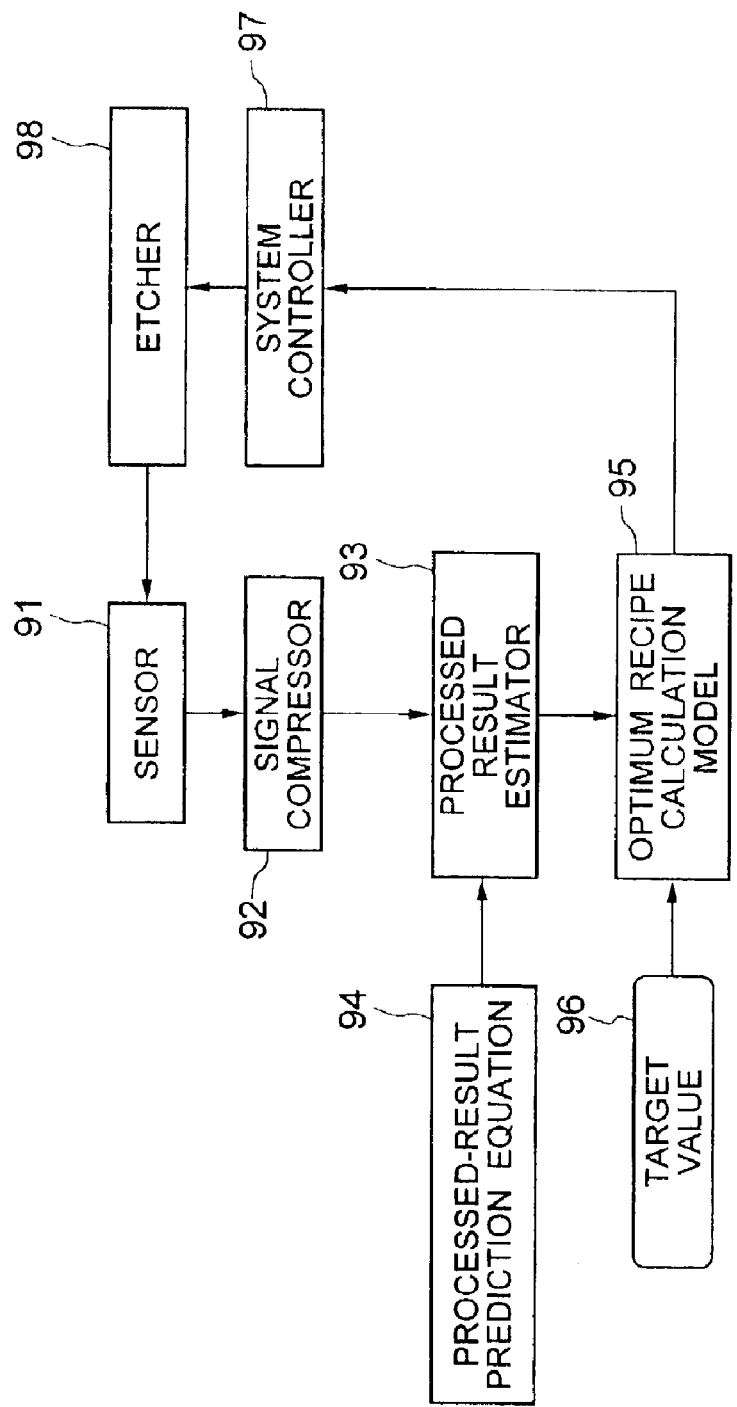
FIG. 9 is a flowchart for explaining etching control of the dry etching system.

FIG. 9 shows a block diagram of etching control of the dry etching system according to the present embodiment.

A sensor 91 for monitoring process parameters and also a processed result can include a sensor such as an emission spectroscope for outputting many pieces of data, a sensor such as a plasma impedance monitor highly sensitive to a plasma state, and various sensors for detecting a pressure, temperature, voltage, power incidence and reflection. Further, a single sensor such as an emission spectroscope, which can acquire many pieces of data at the same time, can be provided. The sensor outputs a signal indicative of a state of the dry etching system at intervals of a constant time, e.g., one second. The number of sensor data pieces per one output of the above sensor is several tens to several thousands of pieces.

A signal compressor 92 compresses such many pieces of data into a system state signal. The number of such system state signals varies from situation to situation and sometimes is several to several thousands of signals. The signal compression may employ a statistical analysis such as a main component analysis.

A processed result estimator 93 generates a processing state signal for each wafer through average or differentiation operation from time changes of the system state signals.

In this connection, an processed-result prediction equation 94 in FIG. 9 is an equation for predicting a processed result of the wafer after processed on the basis of the generated processing state signal of each wafer, and is previously stored in a database. The processed result estimator 93 further predicts a processed shape of the wafer with use of the processing state signal and prediction equation. In this connection, when there is a range of variance in the processed shape among the wafers, the estimator also calculates the variance range.

An optimum recipe calculation model 95 inputs the above predicted result and a processing target value 96 and calculates correction values of the processing conditions so that the processed result becomes the target value. The model 95 passes the corrected processing conditions (optimum recipe) to a system controller 97 to control an etcher 98 for processing of a next wafer. In this case, the accuracy certification of the processed-result prediction equation can be made by comparing a processed-result prediction value with an actually-measured result of the instrument such as a CD-SEM for measuring a processed shape.

Figure 10:
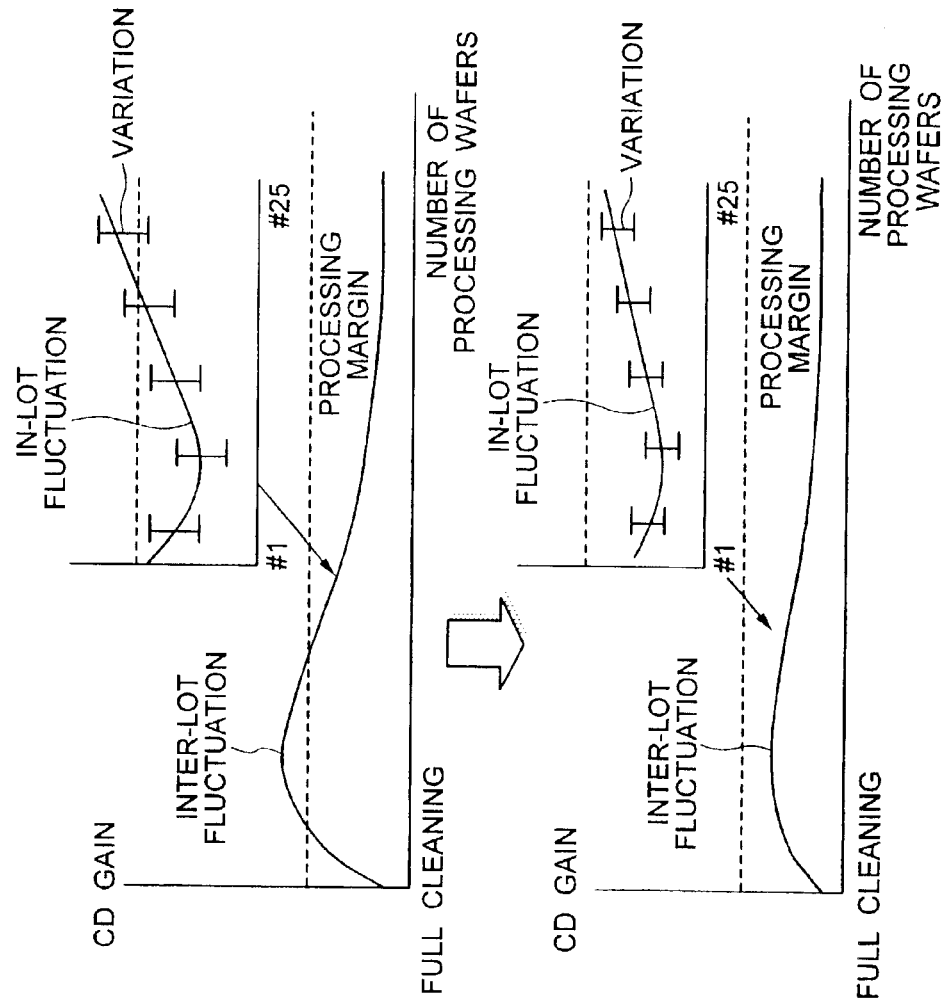
FIG. 10 shows a stabilized effect caused by feedback control or feedforward control.

FIG. 10 shows an effect of stabilization caused by feedback control or feedforward control. In the drawing, a vertical axis or ordinate indicates CD gain and an increase caused by processing of the CD value. For the purpose of production management, it is ideal that the CD gain is kept constant at a slightly positive value. However, due to deposition of a reaction product on the inner wall of a reactor, the state of the plasma or chemistry varies though it is slight, which results in a long-term fluctuation in the processing. The fluctuation is identified as inter-lot fluctuation in the drawing. The fluctuation takes place, in particular, during a time from full cleaning of the reactor after the reactor is opened to the atmosphere and the deposit on the inner wall of the reactor is removed to stabilization of the state on the inner wall surface of the reactor. Further, even in a lot, the deposition of a reaction product or a temperature change on the inner wall surface causes a short-term fluctuation (in-lot fluctuation). Furthermore, the processing of the photolithography or etching step also causes a fluctuation in the processing.

In the prior art, such a fluctuation was accommodated in a device processing margin by hardware improvement of temperature adjustment on the inner wall surface, etc. or by cleaning the wall at intervals of a suitable time (e.g., for each lot or wafer) to remove the deposit to thereby stabilize the state of the reactor. However, as the device is required to be finer and the processing margin is required to be correspondingly smaller, the prior art method had its stabilization limit. Meanwhile, when feedback control or feedforward control is applied as in the present embodiment, it is possible to suppress the inter-lot fluctuation, in-lot fluctuation and processing fluctuation and to accommodate it in the device processing margin, as shown in a lower stage in FIG. 10.

Figure 11:
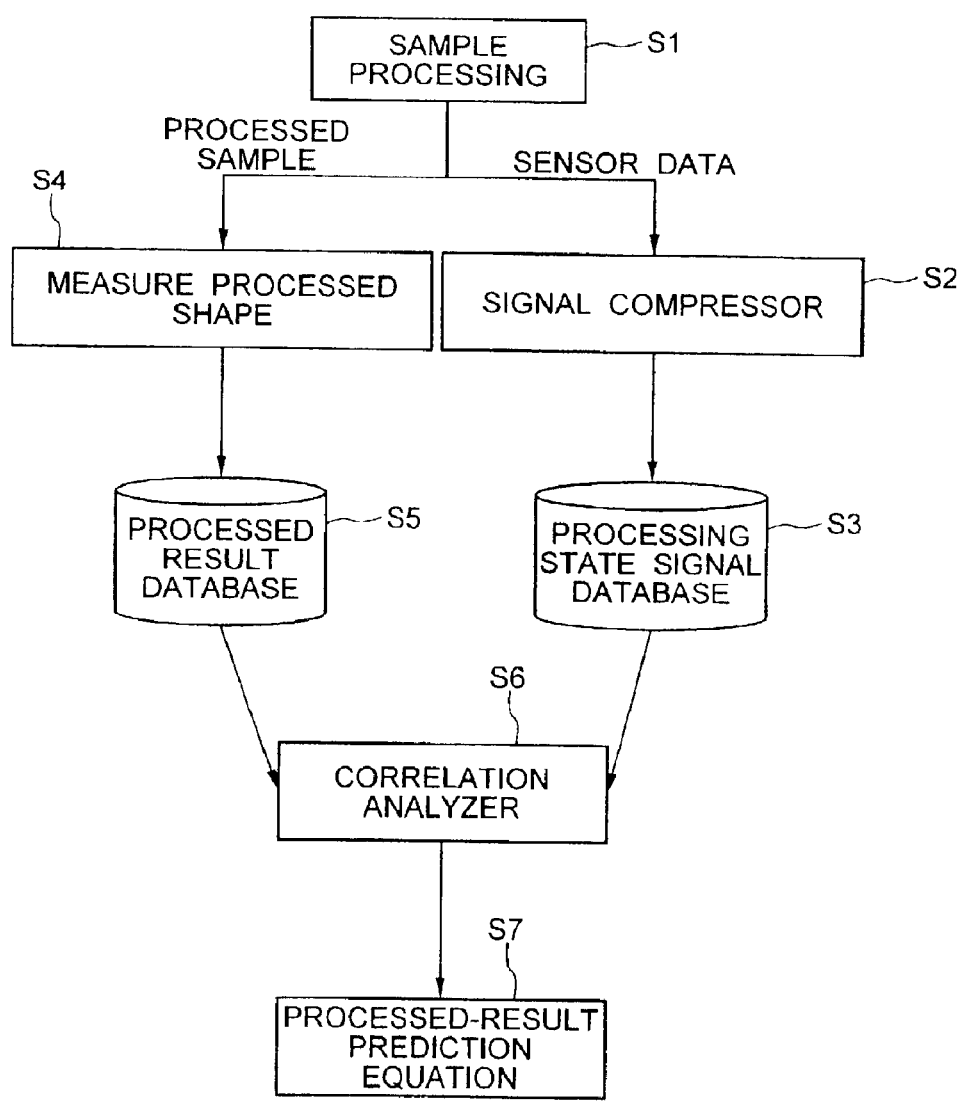
FIG. 11 is a diagram for explaining operations of generating a processed-result prediction equation.

FIG. 11 is a flowchart for explaining how to generate the processed-result prediction equation shown in FIG. 9. In a step S1, first, the system performs etching operation over a sample (wafer) with use of the etcher. The system compresses data about sensors for monitoring process parameters in the data compressor in a step S2, and stores the compressed data in a processing state signal database in a step S3. The system measures the processed shape of the wafer after the above processing, e.g., with use of a CD-SEM in a step S4, and saves it in a processed result database in a step S5. In a step S6, the system finds a correlative relationship between the actually-measured processed shape and processing state signal by multiple regression and generates a processed-result prediction equation.

Figure 12:
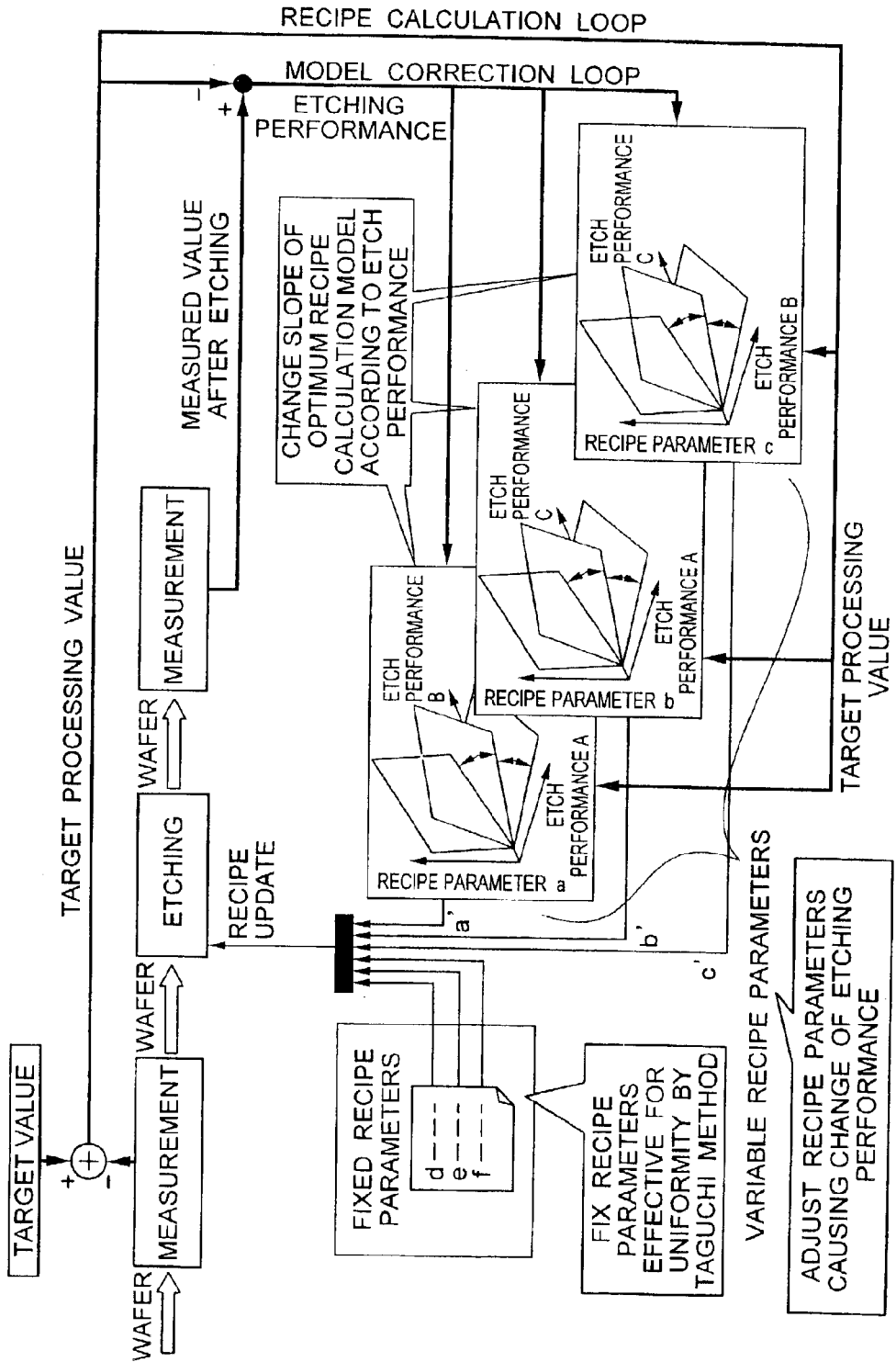
FIG. 12 shows yet another embodiment of the dry etching system.
Figure 13:
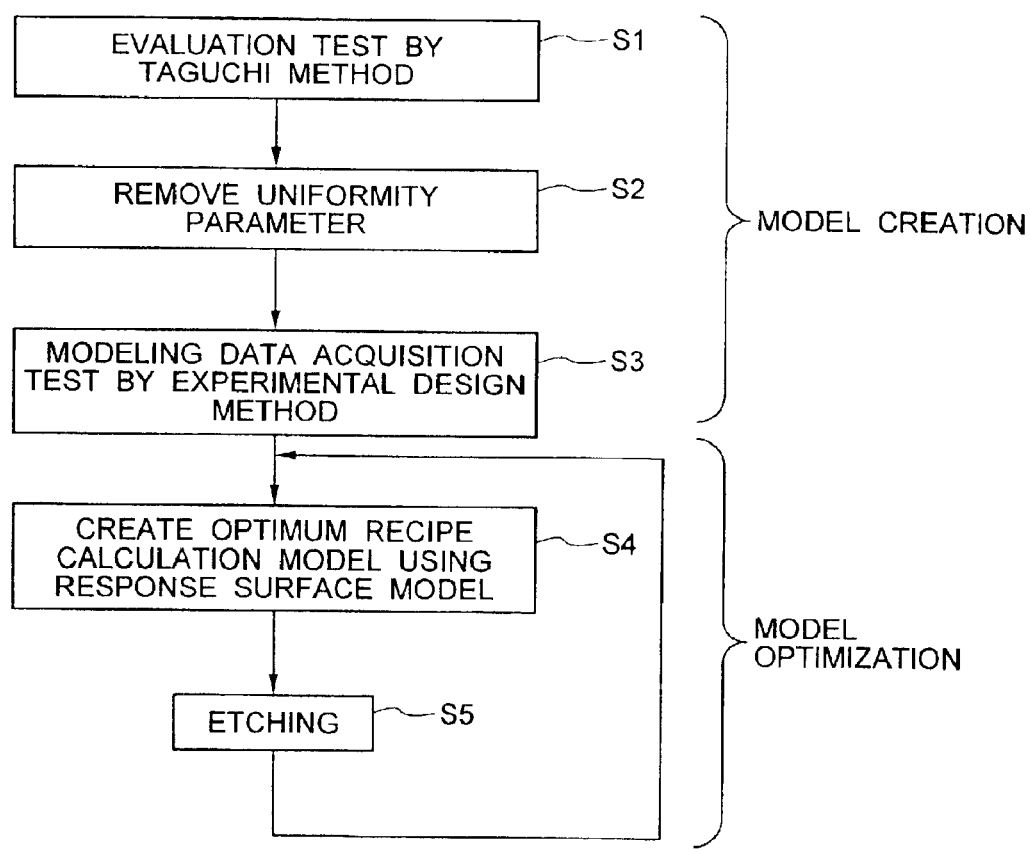
FIG. 13 is a flowchart for explaining how to construct an optimum recipe calculation model.

FIG. 12 shows another control example of the dry etching system of the present invention. In this example, a response surface model generally used for statistical processing was used as a method for modeling an optimum recipe calculation model. FIG. 13 also shows how to construct the optimum recipe calculation model in the example of FIG. 12.

Assume first that A, B and C indicate etching performance items as targets and a, b, c, d, e and f denote 6 recipe parameters to be set for the etching system. A, B and C refer to, e.g., selectivity, side-etching amount, taper angle, etc.; whereas a, b, c, d, e and f refer to, e.g., gas flow rate, pressure, voltage, power, temperature and time respectively. First of all, the system performs an evaluation test by a Taguchi method in a step 1, and selects one or ones of recipe parameters which affect(s) a uniformity and removes it or them from controllable parameters in a step 2. When these parameters (d, e and f in the drawing) are made always stationary as fixed recipe parameters, feedback control (Run-to-Run control) for each wafer prevents the deterioration of the uniformity.

The system acquires data necessary for the modeling by an experimental design method in a step 3, and creates an optimum recipe calculation model in a step 4. In FIG. 11, a three-dimensional model wherein only etch performances A, B, etch performances A, C, and etch performances B, C contribute to the recipe parameters a, b and c respectively, was assumed for easy understanding of a basic idea of the optimum recipe calculation model. In actuality, the optimum recipe calculation model generated by a response surface methodology is a multi-dimensional model which has the etch performances A, B and C as its inputs and has the recipe parameters a, b and c as its outputs. In the construction example, in order to change the etch performance, a method of changing the slope of the model was employed. The recipe parameters a', b' and c' and the fixed recipe parameters d, e and f derived and updated using such a corrected model in this manner are given as processing conditions of a next wafer. The system performs its etching operation according to the etching conditions in a step 5.

Figure 14:
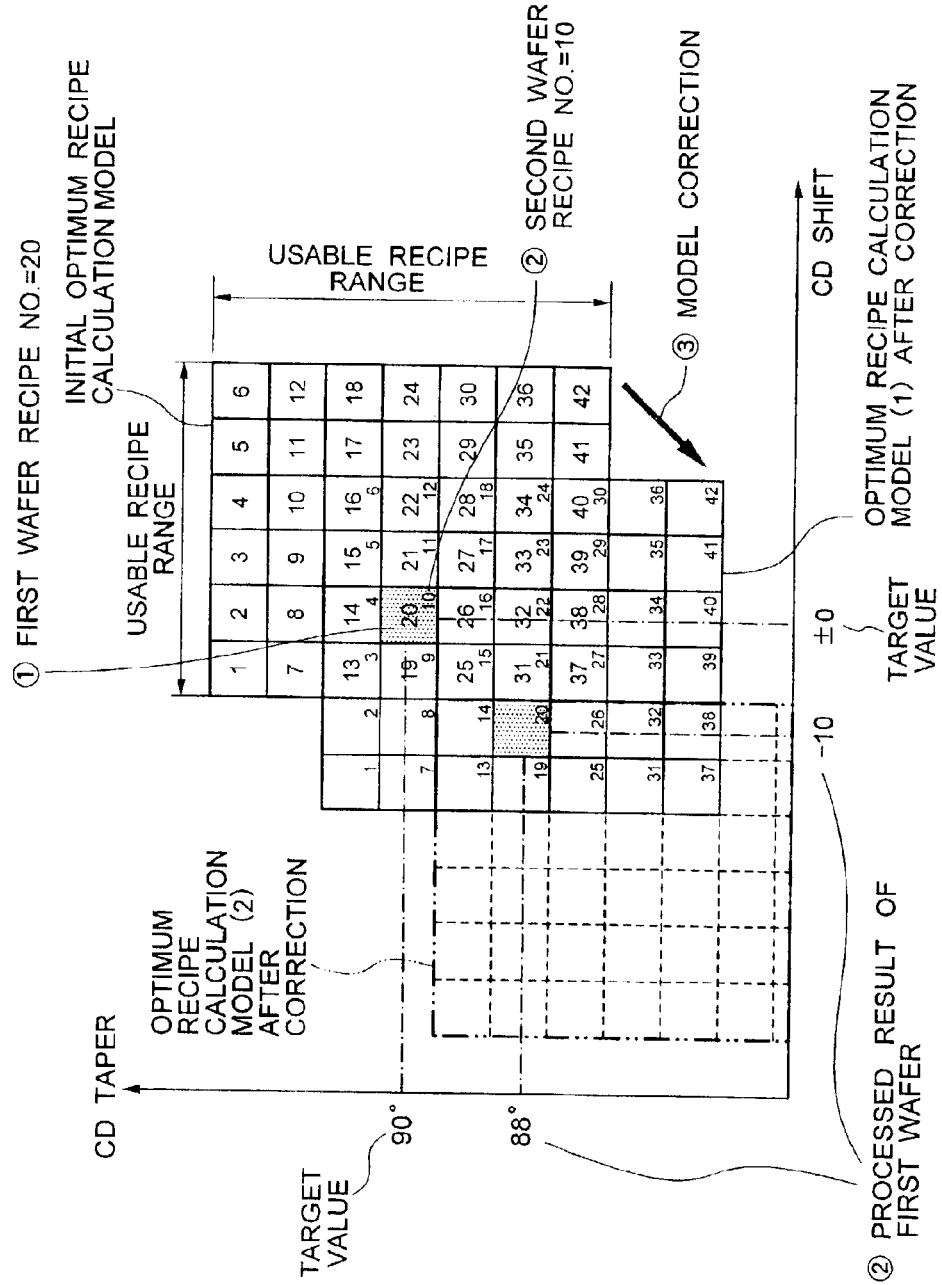
FIG. 14 is a diagram for explaining how to select a usable recipe with use of a usable recipe selecting means.

FIG. 14 is a diagram for explaining how a usable recipe selection means selects a usable recipe. When it is desired in a process to process a first wafer, the system first calculates a recipe No. 20 shown by ① in the drawing using the optimum recipe calculation model on the basis of the target values of the CD shift value and CD taper and performs the recipe processing operation. Although the target values were used as two variables for simplicity of the explanation, two or more variable may be used similarly.

After completing the etching operation over the first wafer, the system measures its processed result by the processed-result estimation model or a measuring instrument such as a CD-SEM. The measured result is assumed to have been shifted from the target as shown by ②. Then, the system judges that the initial calculation mode is fluctuated by a variation with time, moves or tilts the model in such a manner that the initial recipe (corresponding to No. 20 in this case) coincides with the processed result for model correction (that is, moves the initial optimum recipe calculation model to obtain an optimum recipe calculation model (1) after the correction).

Upon etching operation of a second wafer, the system selects an optimum recipe (corresponding to a recipe No. 10 of the second wafer shown by ④, from the target value with use of the corrected optimum recipe calculation model (1).

However, when the model after its correction became "optimum recipe calculation model (2) after its correction" given in the drawing, there exists no optimum recipe as the target value. In this case, accordingly, the system issues an alarm and performs no etching operation. Thus, when the system became abnormal, the system can beforehand prevent production of many defective products. Further, the alarm can be used also as an execution judgement for the maintenance operation called 'full cleaning'. Although the plasma etching system has been used as a typical example for the plasma processing system in the foregoing explanation, the present invention can be applied even to another plasma processing system such as a plasma CVD system.

As has been explained above, in accordance with the present embodiment, since the feedback control or feedforward control is applied on the basis of the outputs of the sensors for monitoring process parameters or on the basis of the measured result of the processed result measuring instrument, the system can suppress inter-lot fluctuation, in-lot fluctuation and variance and can realize accurate device processing.

What is claimed is:

1. A plasma processing control method for controlling a plasma processing apparatus performing plasma processing to a sample accommodated Within a vacuum processing chamber of the processing apparatus, comprising the steps of:

monitoring process parameters during the processing operation for the sample;

estimating a processed result on the basis of a result of said monitoring step;

calculating correction values of processing conditions and generating an optimum recipe on the basis of an estimated result of said estimating step such that the processed result becomes a target value;

previously dividing processing conditions of a plurality of items into two of processing conditions which influence uniformity of a processed result in a sample surface and processing conditions which do not influence the uniformity; and optimizing the processing conditions which influence the uniformity from the viewpoint of uniformity;

wherein said step of generating an optimum recipe includes a step of calculating and correcting correction values of only the processing conditions which do not influence the uniformity in such a manner that the processed result coincides with the target value, combining with the previously-optimized processing conditions which influence the uniformity, and generating an optimum recipe; and controlling the plasma processing apparatus on the basis of said generated optimum recipe.

2. A plasma processing control method as set forth in claim 1, wherein said step of estimating a processed result on the basis of a result of said monitoring step includes an estimation model and also includes a step of correcting said estimation model on the basis of a measured result of a shape of said sample.

3. A plasma processing control method for controlling plasma processing operation performed to a sample accommodated within a vacuum processing chamber, comprising the steps of:

dividing processing conditions of a plurality of items into two of processing conditions which influence uniformity of a processed result in a wafer surface and processing conditions which do not influence the uniformity;

optimizing the processing conditions which influence the uniformity from the viewpoint of uniformity;

generating an optimum recipe including a step of calculating and correcting correction values of only the processing conditions which do not influence the uniformity in such a manner that the processed result coincides with a target value, combining with the previously-optimized processing conditions which influence the uniformity;

judging validity of said optimum recipe; and controlling the plasma processing operation on the basis of the recipe judged as having the validity.

* * * * *